United States Patent [19]

Sanpei et al.

[11] 4,290,009
[45] Sep. 15, 1981

[54] STANDING WAVE RATIO DETECTING APPARATUS

[75] Inventors: Konomu Sanpei; Tadaaki Fujii, both of Katsuta, Japan

[73] Assignee: Hitachi, Ltd., Tokyo, Japan

[21] Appl. No.: 38,277

[22] Filed: May 11, 1979

[30] Foreign Application Priority Data

May 12, 1978 [JP] Japan .................................. 53/55559

[51] Int. Cl.³ .......................................... G01R 27/04
[52] U.S. Cl. ................................. 324/57 R; 324/58B
[58] Field of Search ............... 324/57 R, 58 B, 58 A, 324/58 R, 58.5 B, 95; 455/115, 67

[56] References Cited

U.S. PATENT DOCUMENTS

| | | | |
|---|---|---|---|
| 3,678,381 | 7/1972 | Beaudry | 324/95 |
| 3,842,358 | 10/1974 | Frazier | 455/115 |
| 4,041,395 | 8/1977 | Hill | 455/115 |

*Primary Examiner*—Ernest F. Karlsen
*Attorney, Agent, or Firm*—Craig and Antonelli

[57] ABSTRACT

A standing wave ratio detecting apparatus is disclosed which comprises an integration circuit for integrating a traveling wave detection voltage $V_F$, a comparator circuit for comparing the output voltage $V'_F$ of the integration circuit with a reflected wave detection voltage $V_R$ to a voltage $E_o$ proportional to the voltage ratio $V_R/V'_F$, a control circuit receiving the output voltage $E_o$ of the comparator circuit and turned on or off according as the output voltage $E_o$ is put in a high level or in a low level to lower or raise the output voltage $V'_F$ of the integration circuit, thereby conducting such a control as making the output voltage $V'_F$ approximately equal to said reflected wave detection voltage $V_R$ and maintaining the amplitude of the output voltage $E_o$ constant, a smoothing circuit for deriving an average voltage corresponding to the ratio $V_R/V_F$ of the reflected wave detection voltage $V_R$ to the traveling wave detection voltage $V_F$ from the output voltage $E_o$ of the comparator circuit, and a meter for indicating the average voltage from the smoothing circuit.

5 Claims, 6 Drawing Figures (A)

(B)

$V_F' = V_R - V_x \sim V_R - V_x$ $V \gg 2V_x$ $V_x = \dfrac{R_{84}}{R_{84} + R_{83}} E_O$ (C)

STANDING WAVE RATIO DETECTING APPARATUS

BACKGROUND OF THE INVENTION

1. Field of the Invention

The present invention relates to an apparatus for detecting the standing wave ratio representing the degree of matching between a transmitter and an antenna or the like.

2. Description of the Prior Art

A circuit diagram of a generally-used conventional apparatus for detecting the standing wave ratio is shown in FIG. 1. In this drawing, reference numeral 1 shows a transmitter, numeral 2 a load (antenna), and numeral 3 a directional coupler. The coupler 3 includes a conductor section 31 for conducting an output signal of the transmitter 1 to the load 2, a traveling wave detecting conductor section 32 provided in parallel to the conductor section 31 for detecting the traveling wave F of the signal passing through the conductor section 31, and a reflected wave detecting conductor section 33 provided in parallel to the conductor section 31 for detecting a reflected wave R of the signal reflected from the load 2 to the transmitter 1 by the impedance mismatching between the transmitter 1 and the load 2. An end of each of the conductor sections 32 and 33 is grounded through a common resistor 34. Numeral 4 shows a traveling wave detector circuit connected to the other end of the traveling wave detecting conductor section 32 of the coupler 3 for detecting the traveling wave F detected by the conductor section 32, thus producing a traveling wave detected DC voltage $V_F$. Numeral 5 shows a reflected wave detector circuit connected to the other end of the reflected wave detecting conductor section 33 of the coupler 3 for detecting the reflected wave F detected by the conductor section 32, thus producing a reflected wave detected DC voltage $V_R$. Numeral 6 shows a change-over switch, the fixed terminal CAL of which is connected to the cathode of the detecting diode 41 of the traveling wave detector circuit 4. The fixed terminal SWR of the change-over switch 6, on the other hand, is connected to the cathode of the detecting diode 51 of the reflected wave detector circuit 5. The movable terminal of the switch 6 is grounded through a variable resistor 7 and a standing wave ratio indication meter 8. The cathode of the detecting diode 41 is grounded through a capacitor 42, and the anode thereof is connected to the traveling wave detecting terminal of the traveling wave detecting conductor section 32 of the coupler 3. The cathode of the detecting diode 51 is grounded through a capacitor 52, and the anode thereof is connected to the reflected wave detecting terminal of the reflected wave detecting conductor section 33 of the coupler 3.

In order to detect the standing wave ratio (SWR) in this circuit, first, the switch 6 is closed on CAL side so that the traveling wave detection DC voltage $V_F$ of the traveling wave detector circuit 4 is indicated on the meter 8. Next, the rheostat 7 is adjusted in such a manner that the pointer of the meter 8 is positioned at CAL (calibration) mark on the scale plate 81 of the meter shown by FIG. 2. The switch 6 is turned to the fixed terminal SWR, thus indicating the reflected wave detection DC voltage $V_R$ of the reflected wave detector circuit 5 on the meter 8. In this way, the ratio between the voltages $V_F$ and $V_R$ is detected. The indication on the meter 8 represents the value corresponding to the ratio between the traveling wave and the reflected wave. Therefore, if the standing wave ratio is calibrated on the meter 8, an indication on the scale plate 81 of the meter 8 shows a standing wave ratio.

In this type of conventional circuit, however, the change-over of the switch 6 and the adjustment of the rheostat 7, i.e., CAL adjustment are required each time of detection of the standing wave ratio, thus very much complicating the operation thereof.

SUMMARY OF THE INVENTION

An object of the present invention is to provide a standing wave ratio detecting apparatus capable of detecting the standing wave ratio automatically without the need of CAL adjustment.

In order to attain the above object, a standing wave ratio detecting apparatus according to the present invention comprises an integration circuit for integration a traveling wave detection voltage $V_F$, a comparator circuit for comparing an integrated output voltage $V'_F$ from the integration circuit with a reflected wave detection voltage $V_R$ to deliver a voltage proportional to the ratio of $V_R$ to $V'_F$, a control section for receiving the output voltage of the comparator circuit to conduct such a control as making the integrated output voltage $V'_F$ approximately equal to the reflected wave detection wave $V_R$ and as keeping constant the amplitude of the output voltage of the comparator circuit, a smoothing circuit for smoothing the output voltage $E_o$ of the comparator circuit to deliver an average voltage corresponding to the ratio $V_R/V_F$ of the reflected wave detection voltage $V_R$ to the traveling wave detection voltage $V_F$, and a standing wave ratio indication meter for indicating the output voltage of the smoothing circuit.

According to the present invention, the standing wave ratio can be automatically measured, and such operations required in the conventional circuit as the CAL adjustment can be eliminated.

DESCRIPTION OF THE PREFERRED EMBODIMENTS

Figure 1:
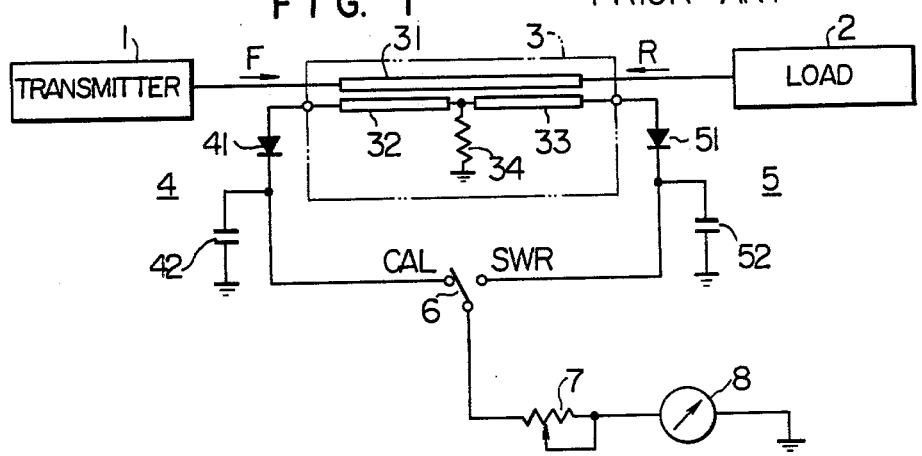
FIG. 1 is a circuit diagram showing a conventional standing wave ratio detecting apparatus.
Figure 3:
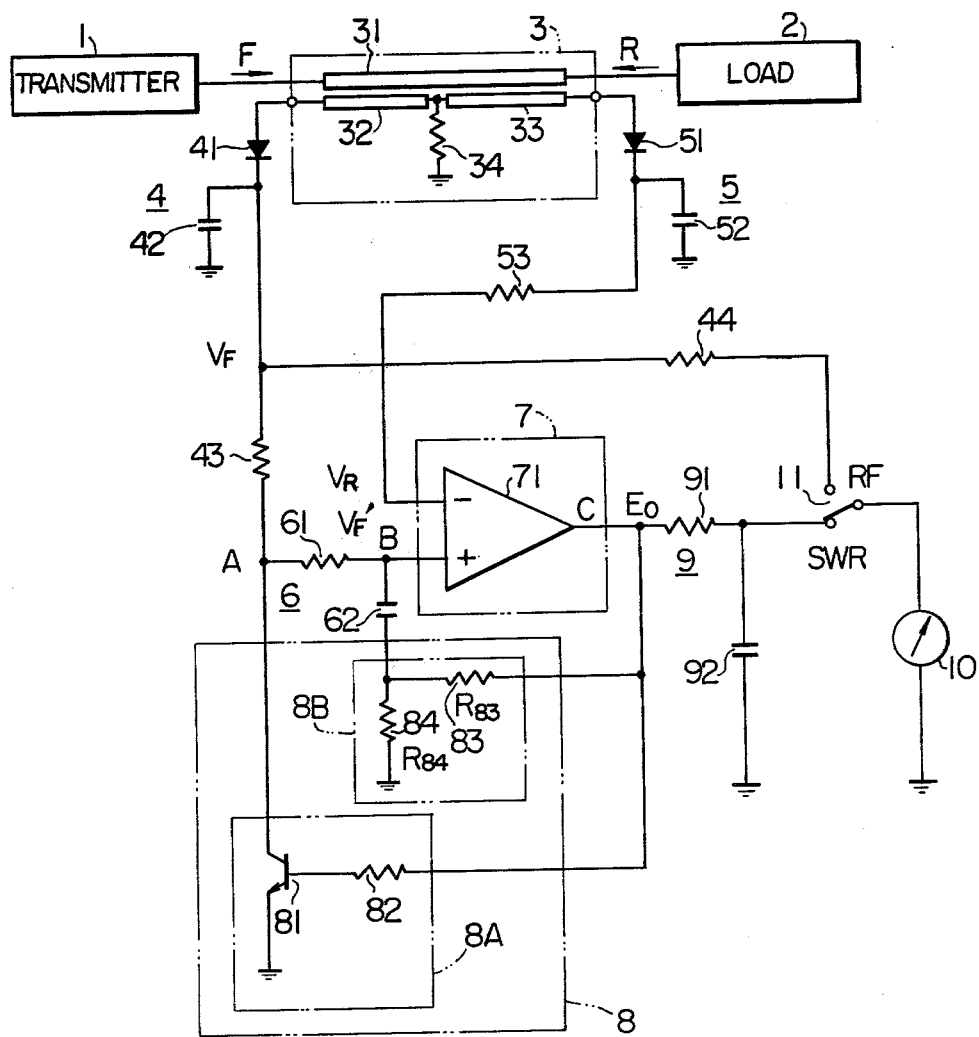
FIG. 3 is a circuit diagram showing an embodiment of the standing wave ratio detecting apparatus according to the present invention.
Figure 2:
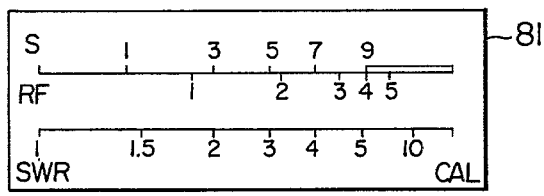
FIG. 2 is an elevation showing the scale plate of a conventional meter.
Figure 5:
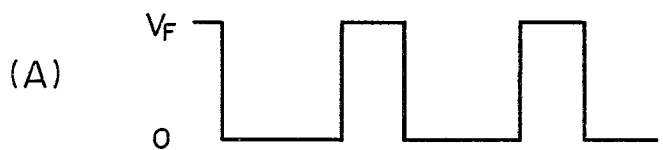
FIG. 5 represents signal waveforms for explaining the circuit of FIG. 3.
Figure 5:
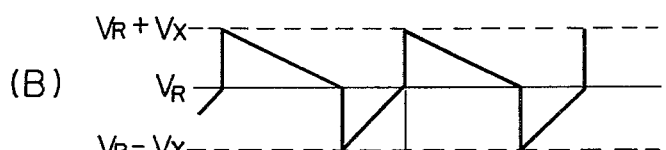
Figure 5:
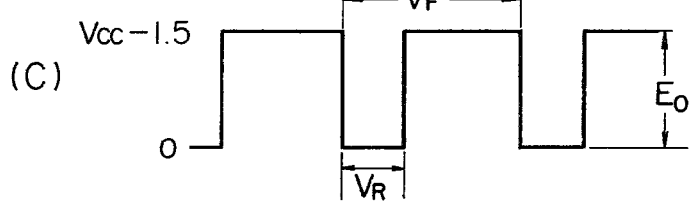

The present invention will be described below with reference to the drawings. FIGS. 3 and 5 show a circuit diagram of an embodiment of the present invention, and signal waveforms at the essential parts of the circuit of FIG. 3, respectively. In FIG. 3, like component elements as those in FIG. 1 are denoted by like reference numerals and will not be described in detail.

Referring to FIG. 3, reference numeral 6 denotes an integration circuit connected to the output side of a traveling wave detector circuit 4 for integrating a traveling wave detection voltage $V_F$. The integration circuit 6 is made up of a resistor 61 and a capacitor 62. Reference numeral 7 denotes a comparator circuit connected to the output side of the integration circuit 6 and the output side of a reflected wave detector circuit 5 for comparing the output voltage $V'_F$ of the integration circuit with a reflected wave detection voltage $V_R$. The comparator circuit 7 is formed by, for example, an operational amplifier 71 manufactured by Nippon Electric Co., Ltd. ($\mu$pc 324C ¼). The operational amplifier 71 is well known, and therefore will not be explained in detail. The noninverting input port (positive port) of the operational amplifier 71 is connected to the cathode of a diode 41 of the traveling wave detector circuit 4 through the resistor 61 of the integration circuit 6 and a resistor 43, and is grounded through the capacitor 62 of the integration circuit 6 and a resistor 84. The inverting input port (negative) port of the operational amplifier 71 is connected through a resistor 53 to the cathode of a diode 51 of the reflected wave detector circuit 5. Reference numeral 8 denotes a control section coupled with the comparator circuit 7 and the integration circuit 6 for conducting such a control as making the output voltage $V'_F$ of the integration circuit 6 approximately equal to the reflected wave detection voltage $V_R$ and as keeping constant the output voltage of the comparator circuit 7. The control section 8 is made up of a charge/discharge control circuit 8A and a voltage dividing circuit 8B. The charge/discharge control circuit 8A is connected to the output side of the operational amplifier 71 and the input side of the integration circuit 6, and includes a switching transistor 81. When the output voltage of the operational amplifier 71 is put in a low level, the transistor 81 is made non-conductive (or high-impedance state) to expedite the charging of the capacitor 62 and to raise the output voltage $V'_F$ of the integration circuit toward the traveling wave detection voltage $V_F$. On the other hand, when the output voltage of the operational amplifier 71 is put in a high level, the transistor 81 is made conductive (or low-impedance state) to discharge electric charges stored on the capacitor 62 and to lower the output voltage $V'_F$. The voltage dividing circuit 8B is connected to the output side of the operational amplifier 71 and to the capacitor 62 of the integration circuit, and includes voltage-dividing resistors 83 and 84 to conduct, in cooperation with the charge/discharge control circuit 8A, such a control as making the output voltage $V'_F$ of the integration circuit 6 approximately equal to the reflected wave detection voltage $V_R$ and as keeping constant the amplitude of the output voltage of the operational amplifier 71. The base of the transistor 81 is connected through a resistor 82 to the output side of the operational amplifier 71, and the collector of the transistor 81 is connected through the resistor 61 of the integration circuit 6 with the noninverting input port of the operational amplifier 71. The output terminal of the operational amplifier 71 is connected through the resistor 83 of the voltage dividing circuit 8B to a junction point between the capacitor 62 and the resistor 84. Reference numeral 9 denotes a smoothing circuit connected with the output terminal of the operational amplifier 71 in the comparator circuit 7. The smoothing circuit 9 derives an average voltage corresponding to the ratio $V_R/V_F$ of the reflected wave detection voltage $V_R$ to the traveling wave detection voltage $V_F$ from the output voltage of the operational amplifier 71 to supply the average voltage to a standing wave ratio indication meter 10 through a change-over switch 11. The fixed terminal SWR or the standing wave ratio detection terminal of the change-over switch 11 is connected through the smoothing circuit 9 with the output terminal of the operational amplifier 71, and the fixed terminal RF or the high frequency output detection terminal is connected through a resistor 44 with the cathode of the diode 41 of the traveling wave detector circuit 4. The movable terminal of the switch 11 is grounded through the meter 10. The meter 10 can indicate the high frequency output (the traveling wave input) in addition to the standing wave ratio.

The circuit operation of such a circuit arrangement will be explained below for the case when the switch 11 is turned to the fixed terminal SWR.

The traveling wave detection voltage (a positive d.c. voltage) $V_F$ (see (A) of FIG. 5) from the traveling wave detector circuit 4 is applied to the noninverting input port of the operational amplifier 71 in the comparator circuit 7 through the resistor 43 and the integration circuit 6. While, the reflected wave detection voltage (a positive d.c. voltage) $V_R$ from the reflected wave detector circuit 5 is applied to the inverting input port of the operational amplifier 71 through the resistor 53. Then, as is well known, the operational amplifier 71 produces on the output terminal c thereof a voltage $E_o$ such as shown at (C) in FIG. 5. Now, let us assume that the output voltage $V'_F$ of the integration circuit 6 and the reflected wave detection voltage $V_R$ (see (B) of FIG. 5) have the relation $V'_F < V_R$ (see (B) of FIG. 5), and that the output voltage $E_o$ of the operational amplifier 71 is put in the low level. Then, the transistor 81 of the charge/discharge control circuit 8A is turned off through the application of such a low-level voltage to the base thereof. Thus, the capacitor 62 of the integration circuit 6 is charged toward the traveling wave detection voltage $V_F$. Owing to the charging, the voltage $V'_F$ applied to the noninverting input port of the operational amplifier 71 is raised, and the output voltage of the operational amplifier 71 assumes the high level when the voltage $V'_F$ is raised to the reflected wave detection voltage $V_R$. The output voltage $E_o$ in the high level is voltage-divided by the resistors 83 and 84 of the voltage dividing circuit 8B. The divided voltage $$\frac{R_{84}}{R_{84} + R_{83}} E_o$$

is applied to the noninverting input port of the operational amplifier 71 to maintain the output voltage $E_o$ at the high level. When the output voltage $E_o$ is put in the high level, the transistor 81 of the charge/discharge control circuit 8A is simultaneously turned on through the application of such a high-level voltage to the base thereof. When the transistor 81 is put in the on-state, electric charges stored on the capacitor 62 of the integration circuit 6 are discharged through the resistor 61 and the transistor 81. Owing to the discharge, the voltage $V'_F$ applied to the noninverting input port of the operational amplifier 71 is lowered. When the voltage $V'_F$ is decreased to the reflected wave detection voltage $V_R$, the output voltage $E_o$ of the operational amplifier 71 is put in the low level. The output voltage $E_o$ in the low level is voltage-divided by the resistors 83 and 84. The divided voltage $$\frac{R_{84}}{R_{83} + R_{84}} E_o$$

is applied to the noninverting input port of the operational amplifier 71 through the capacitor 62 to maintain the output voltage $E_o$ at the low level. Simultaneously with the change-over of the output voltage $E_o$ to the low level, the transistor 81 is again turned off, and the charging of the capacitor 62 recommences. The above operation is repeated.

The change of the voltage $V'_F$ applied to the noninverting input port of the operational amplifier due to the charge and discharge of the capacitor 62 can be limited within a narrow range (for example, 80 mV) by making the resistance (for example, 1 KΩ) of the resistor 83 of the voltage dividing circuit 8B far smaller than the resistance (for example, 100 KΩ) of the resistor 84. Accordingly, the voltage $V'_F$ can be considered to be approximately equal to the voltage $V_R$. Further, the time constant in charging up the capacitor 62 can be made approximately equal to that in discharge time by making the resistance (for example, 4.7 KΩ) of the resistor 43 far smaller than the resistance (for example, 100 KΩ) of the resistor 61 of the integration circuit 6.

Referring to (B) of FIG. 5, the time $t_1$ required to charge up the capacitor 62 from $V_R$-$V_X$ to $V_R$, that is, the time required to charge up the capacitor from the voltage nearly equal to $V_R$ toward $V_R$ by a minute voltage $V_X$ is given by the following equation:

$$t_1 = \frac{V_X}{V_F - V_R} T,$$

where T indicates the time constant.

The time $t_2$ required to decrease the voltage of the capacitor 62 from $V_R + V_X$ to $V_R$ through the discharge, that is, the time required to decrease the voltage of the capacitor 62 from the voltage nearly equal to $V_R$ toward 0V by a minute voltage $V_X$ is given by the following equation:

$$t_2 = \frac{V_X}{V_R} T,$$

where T indicates the time constant.

Accordingly, when the above-mentioned two conditions concerning the relation in resistance between the resistors 83 and 84 and the relation in resistance between the resistors 43 and 61 are satisfied, the ratio of the charging time to one period of charge and discharge is given by the following equation:

$$\frac{\text{charging time}}{\text{one period of charge and discharge}} = \frac{t_1}{t_1 + t_2} =$$

$$\frac{\frac{1}{V_F - V_R}}{\frac{1}{V_F - V_R} + \frac{1}{V_R}} = \frac{V_R}{V_R + (V_F - V_R)} = \frac{V_R}{V_F}$$

Figure 6:
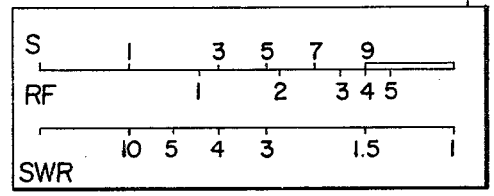
FIG. 6 is an elevation showing the scale plate of the meter used in the standing wave ratio detecting apparatus according to the present invention.
Figure 4:
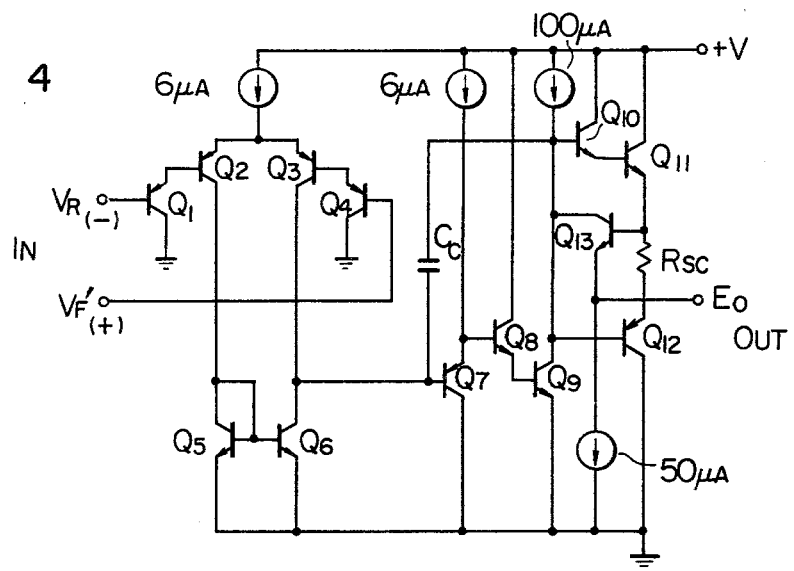
FIG. 4 illustrates an embodiment of the comparator circuit according to the present invention.

When the supply voltage of the operational amplifier 71 is stabilized, the amplitude of the output voltage $E_o$ of the amplifier 71 is maintained at a constant value, and thus the average value of the output voltage $E_o$ is a function of $V_R/V_F$. Accordingly, the standing wave ratio voltage VSWR equal to $$\frac{V_F + V_R}{V_F - V_R}$$

can be automatically indicated on the meter 10 by providing on the meter 10 such a standing wave ratio scale SWR as shown in FIG. 6.

When it is desired to measure the signal wave input and the high frequency output with the circuit shown in FIG. 3, the switch 11 is turned to the fixed terminal RF, although means for detecting the signal wave input are not shown.

FIG. 6 is a view showing a scale plate 101. In the scale plate 101, an upper scale S, intermediate scale RF and lower scale SWR indicate the signal wave input, high frequency output and standing wave ratio, respectively. As is seen in FIG. 6, figures on the SWR scale are given in the reverse direction as compared with those on each of the S and RF scales, that is, smaller figures on the SWR scale are arranged on the side of bigger figures on the S and RF scales. Such an arrangement corresponds to the directions of the scales at a time when the communication is conducted in a favorable condition, and thus makes the apparatus convenient for use.

We claim:

1. A standing wave ratio detecting apparatus provided with detector means for obtaining a traveling wave detection voltage $V_F$ and a reflected wave detection voltage $V_R$ and with a standing wave ratio indication meter, comprising:
    an integration circuit connected to said detector means for integrating said traveling wave detection voltage $V_F$ to deliver an integrated voltage $V'_F$;
    a comparator circuit connected to said integration circuit and said detector means for comparing said integrated voltage $V'_F$ from said integration circuit and said reflected wave detection voltage $V_R$ from said detector means;
    control means connected to said comparator circuit and said integration circuit for causing said integrated voltage $V'_F$ from said integration circuit to be approximately equal to said reflected wave detection voltage $V_R$ in response to the output voltage $E_o$ of said comparator circuit, the output voltage of said comparator circuit having a duty ratio related to the ratio between the traveling wave detection voltage $V_F$ and the reflected wave detection voltage $V_R$; and
    a smoothing circuit connected to said comparator circuit and said standing wave ratio indication meter for deriving from said output voltage $E_o$ of said comparator circuit an average voltage corresponding to the ratio $V_R/V_F$ of said reflected wave detection voltage $V_R$ to said traveling wave detection voltage $V_F$ to supply said average voltage to said standing wave ratio indication meter.

2. A standing wave ratio detecting apparatus according to claim 1, wherein said comparator circuit is formed of an operational amplifier for comparing said integrated voltage $V'_F$ from said integration circuit with said reflected wave detection voltage $V_R$ and for providing said output voltage $E_o$ at a high level when said integrated voltage $V'_F$ is greater than said reflected wave detection voltage $V_R$ and said output voltage $E_o$ at a low level when $V'_F$ is smaller than $V_R$, wherein said control means includes a charge/discharge control circuit connected to the output side of said operational amplifier and to the input side of said integration circuit, and a voltage dividing circuit connected to the output side of said operational amplifier and to said integration circuit, and wherein said charge/discharge control circuit is kept in a high-impedance state when said output voltage $E_o$ of said operational amplifier is at a low level to expedite the rise of said output voltage $V'_F$ of said integration circuit toward said traveling wave detection voltage $V_R$ and is kept in a low-impedance state when said output voltage $E_o$ is at a high level to lower said output voltage $V'_F$ of said integration circuit, and said voltage dividing circuit, in cooperation with said charge/discharge control circuit, causing said output voltage $V'_F$ of said integration circuit to be approximately equal to said reflected wave detection voltage $V_R$.

3. A standing wave ratio detecting apparatus according to claim 1, wherein said comparator circuit includes an operational amplifier for comparing said integrated voltage $V'_F$ from said integrated circuit with said reflected wave detection voltage $V_R$ and for providing said output voltage $E_o$ at a high level when said integrated voltage $V'_F$ is greater than said reflected wave detection voltage $V_R$ and said output voltage $E_o$ at a low level when $V'_F$ is smaller than $V_R$.

4. A standing wave ratio detecting apparatus according to claim 1, wherein said control means includes a charge/discharge control circuit connected to the output side of said comparator circuit and to the input side of said integration circuit, and a voltage dividing circuit connected to the output side of said comparator circuit and to said integration circuit, and wherein said charge/discharge control circuit is kept in a high-impedance state when said output voltage $E_o$ of said comparator circuit is at a low level to expedite the rise of said output voltage $V'_F$ of said integration circuit toward said traveling wave detection voltage $V_R$ and is kept in a low-impedance state when said output voltage $E_o$ is at a high level to lower said output voltage $V'_F$ of said integration circuit, and said voltage dividing circuit, in cooperation with said charge/discharge control circuit, causing said output voltage $V'_F$ of said integration circuit to be approximately equal to said reflected wave detection voltage $V_R$.

5. A standing wave ratio detecting apparatus provided with detector means for detecting a traveling wave and a reflected wave to obtain a traveling wave detection voltage $V_F$ and a reflected wave detection voltage $V_R$ and with a standing wave ratio indication meter, comprising:

an integration circuit connected to the output side of a traveling wave detector in said detector means and made up of a resistor and a capacitor for integrating said traveling wave detection voltage $V_F$ to obtain an integrated voltage $V'_F$;

an operational amplifier, connected to a junction point of said resistor and said capacitor making up said integration circuit and to the output side of a reflected wave detector in said detector means, for comparing said average voltage $V'_F$ from said integration circuit with said reflected wave detection voltage $V_R$ from said detector means to deliver said output voltage $E_o$ at a high level when said average voltate $V'_F$ is greater than said reflected wave detection voltage $V_R$ and to deliver said output voltage $E_o$ at a low level when $V'_F$ is smaller than $V_R$;

a switching element connected to the output side of said operational amplifier and to a junction point of said resistor in said integration circuit and the output side of said traveling wave detector, said switching element being kept in a high-impedance state when said output voltage $E_o$ of said operational amplifier is at a low level to expedite the charging of said capacitor in said integration circuit and being kept in a low-impedance state when said output voltage $E_o$ is at a high level to discharge electric charges stored in said capacitor;

a voltage dividing circuit including a first voltage-dividing resistor and a second voltage-dividing resistor for conducting such a control as making said output voltage $V'_F$ of said integration circuit approximately equal to said reflected wave detection voltage $V_R$ in cooperation with said switching element, said first voltage-dividing resistor being connected to the output side of said operational amplifier and to the earth side of said capacitor in said integration circuit, said second voltage-dividing resistor being connected to a junction point of said capacitor and said first voltage-dividing resistor and to the ground, the resistance of said second voltage-dividing resistor being far smaller than the resistance of said first voltage-dividing resistor; and a smoothing circuit connected to the output side of said operational amplifier and to said standing wave ratio indication meter for deriving an average voltage corresponding to a ratio $V_R/V_F$ of said reflected wave detection $V_R$ to said traveling wave detection voltage $V_F$ from said output voltage $E_o$ of said operational amplifier to supply said average voltage to said standing wave ratio indication meter.

* * * * *